(12) United States Patent
Cholet

(10) Patent No.: US 7,799,696 B2
(45) Date of Patent: Sep. 21, 2010

(54) METHOD OF MANUFACTURING AN INTEGRATED CIRCUIT

(75) Inventor: Stéphane Cholet, Fontenay aux Roses (FR)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 481 days.

(21) Appl. No.: 11/961,828

(22) Filed: Dec. 20, 2007

(65) Prior Publication Data

US 2009/0159558 A1 Jun. 25, 2009

(51) Int. Cl.
*H01L 21/302* (2006.01)
*H01L 21/461* (2006.01)

(52) U.S. Cl. .................... 438/734; 438/710; 216/47

(58) Field of Classification Search ............... 438/734, 438/710; 216/41
See application file for complete search history.

(56) References Cited

U.S. PATENT DOCUMENTS

| 4,997,520 | A | 3/1991 | Jucha et al. |
|---|---|---|---|
| 6,268,287 | B1 | 7/2001 | Young et al. |
| 6,296,777 | B1 | 10/2001 | Engelhardt et al. |
| 6,454,956 | B1 | 9/2002 | Engelhardt et al. |
| 6,524,964 | B2 | 2/2003 | Yu |
| 6,534,411 | B1 | 3/2003 | Shen et al. |
| 6,597,516 | B2 | 7/2003 | Saitoh et al. |
| 6,852,640 | B2 | 2/2005 | Gutsche |
| 6,939,722 | B2 | 9/2005 | Okazawa et al. |
| 6,939,808 | B2 | 9/2005 | Tzou et al. |
| 6,984,529 | B2 | 1/2006 | Stojakovic et al. |
| 7,060,628 | B2 * | 6/2006 | Huang et al. ............... 438/714 |
| 7,256,130 | B2 * | 8/2007 | Spandre ..................... 438/710 |
| 2002/0146851 | A1 | 10/2002 | Okazawa et al. |
| 2002/0173163 | A1 | 11/2002 | Gutsche |
| 2002/0177984 | A1 | 11/2002 | Kautzsch et al. |
| 2003/0003756 | A1 | 1/2003 | Yu |
| 2003/0007260 | A1 | 1/2003 | Saitoh et al. |
| 2004/0023502 | A1 | 2/2004 | Tzou et al. |
| 2005/0051820 | A1 | 3/2005 | Stojakovic et al. |
| 2005/0163079 | A1 | 7/2005 | Taniuchi et al. |

FOREIGN PATENT DOCUMENTS

| DE | 197 33 391 A1 | 8/1997 |
|---|---|---|
| DE | 10 2006 031 339 A1 | 1/2008 |
| EP | 0 895 278 A2 | 7/1998 |

* cited by examiner

*Primary Examiner*—Roberts Culbert

(57) ABSTRACT

A method of manufacturing an integrated circuit including a memory device that includes the following processes: forming a mask layer structure above a composite structure including a resistivity changing layer and an electrode layer disposed above the resistivity changing layer; partially patterning the mask layer structure using a first substance; stopping patterning the mask layer structure before exposing the top surface of the electrode layer; at least partially exposing the top surface of the electrode layer using a second substance, the second substance chemically not reacting with the electrode layer material.

24 Claims, 6 Drawing Sheets

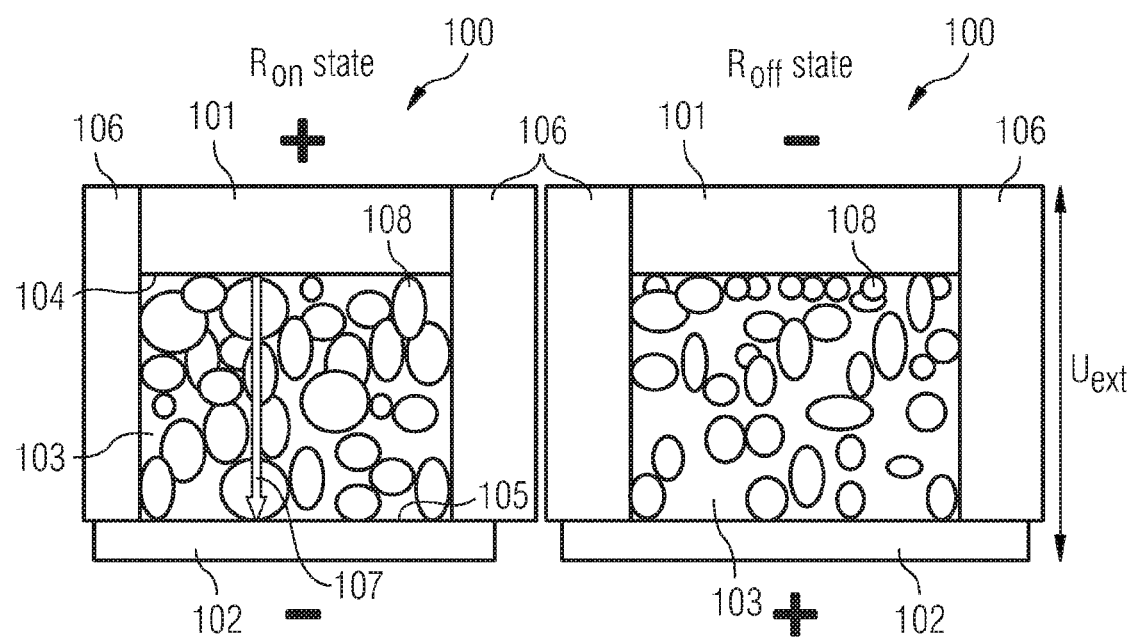
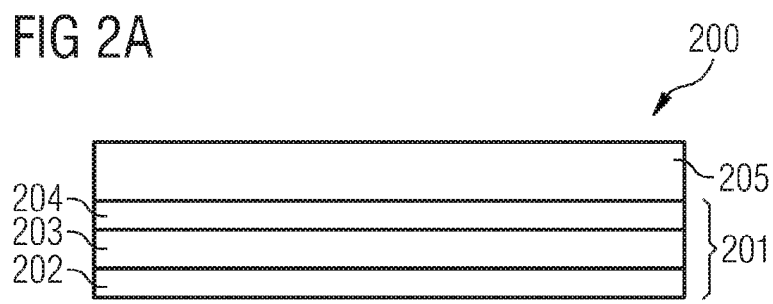
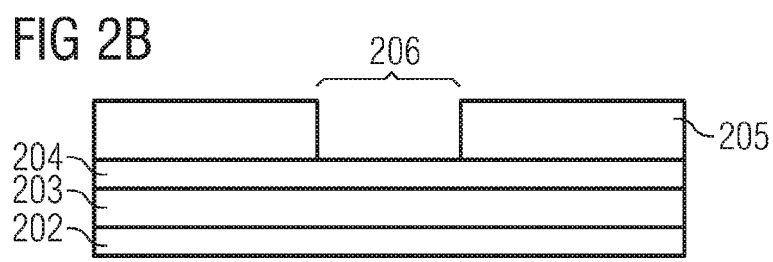

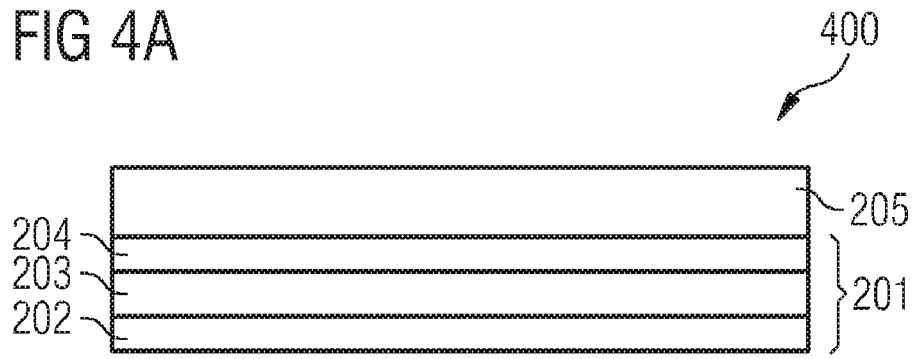
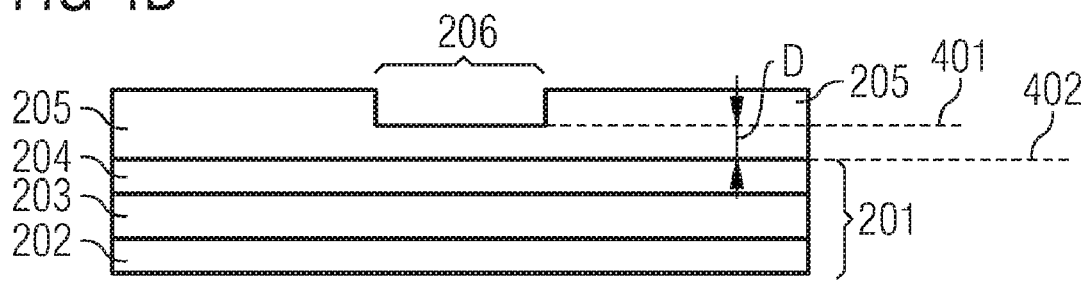
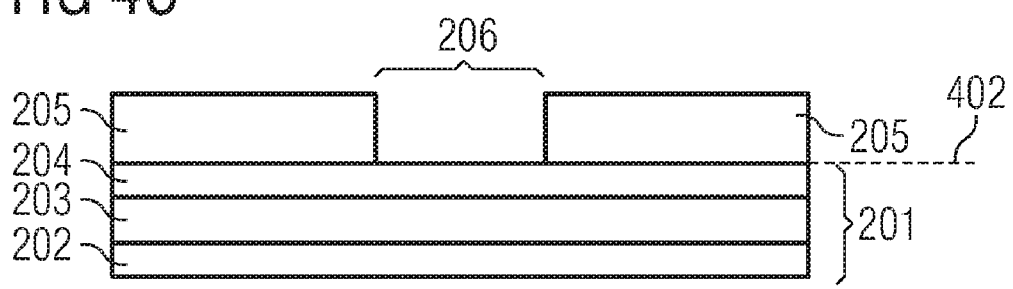

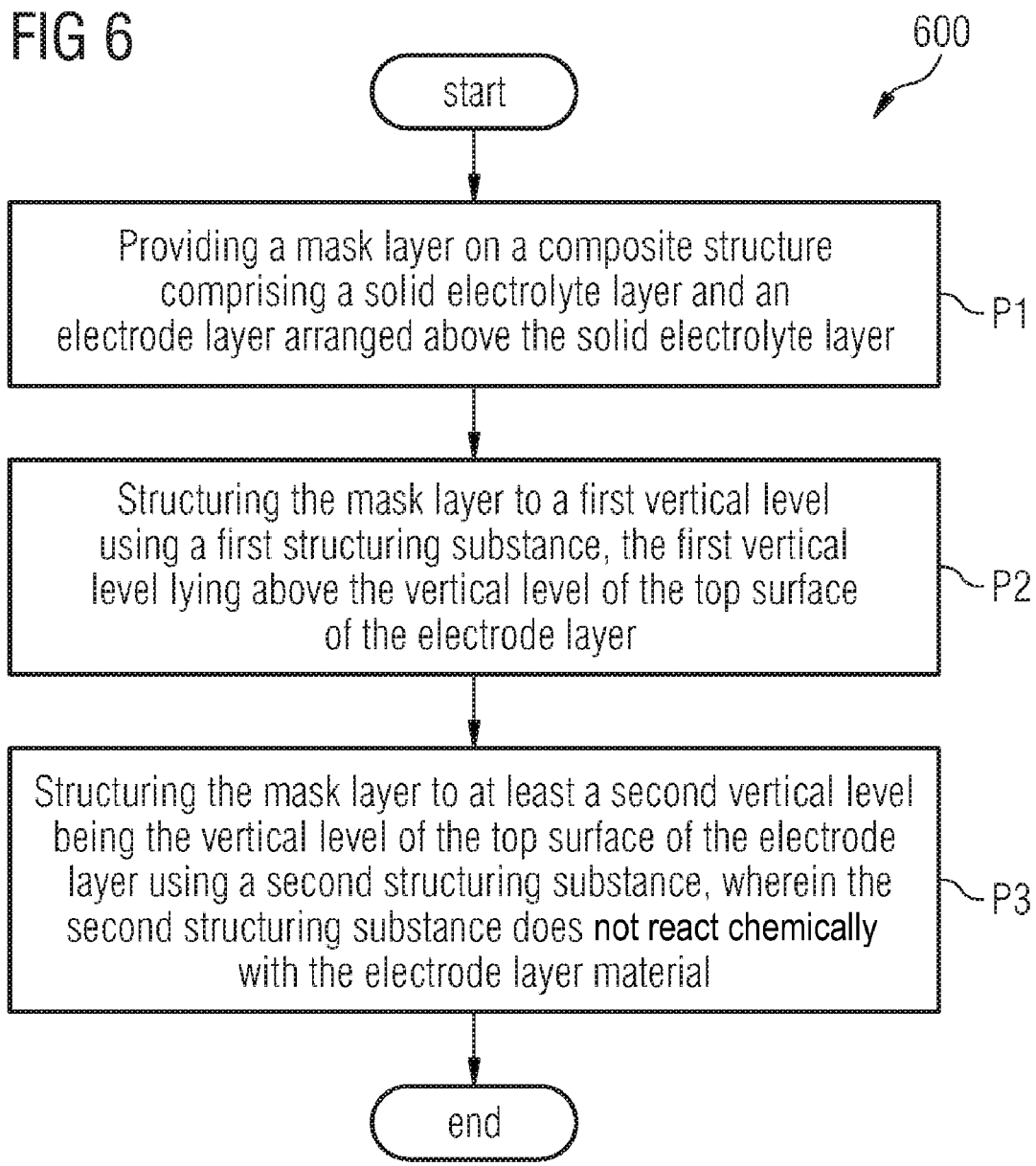

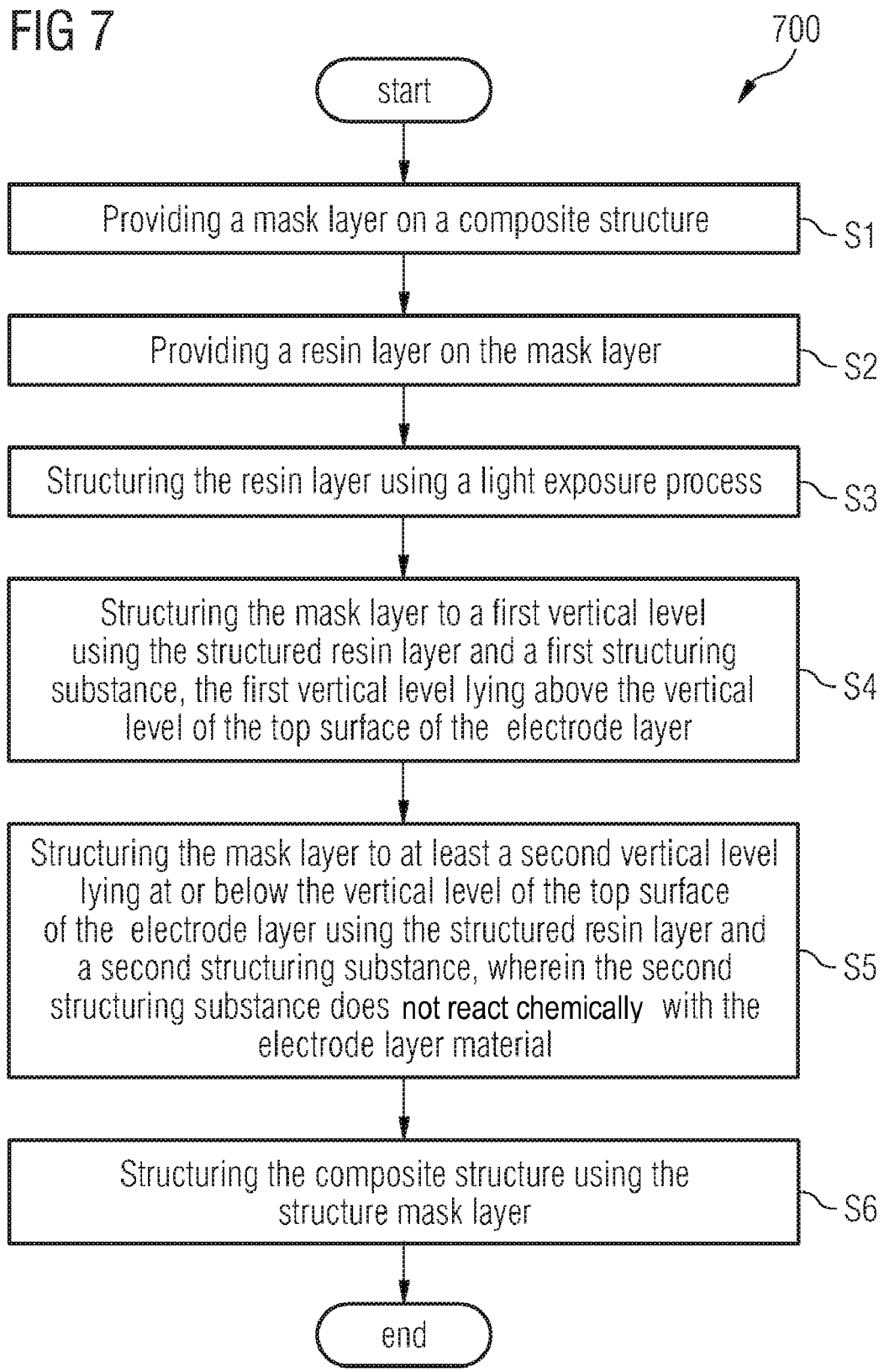

METHOD OF MANUFACTURING AN INTEGRATED CIRCUIT

TECHNICAL FIELD

Embodiments of the present invention relate to a method of manufacturing an integrated circuit.

BRIEF DESCRIPTION OF THE DRAWINGS

For a more complete understanding of exemplary embodiments of the present invention and the advantages thereof, reference is now made to the following description taken in conjunction with the accompanying drawings, in which:

FIG. 1A shows a schematic cross-sectional view of a solid electrolyte memory device set to a first memory state;

FIG. 1B shows a schematic cross-sectional view of a solid electrolyte memory device set to a second memory state;

FIGS. 2A to 2B show schematic cross-sectional views of manufacturing stages of a method of manufacturing a solid electrolyte memory device;

FIGS. 4A to 4C show schematic cross-sectional views of manufacturing stages of a method of manufacturing a solid electrolyte memory device according to one embodiment of the present invention;

FIG. 6 shows a flow chart illustrating a method of manufacturing a solid electrolyte memory device according to one embodiment of the present invention; and FIG. 7 shows a flow chart illustrating a method of manufacturing a solid electrolyte memory device according to one embodiment of the present invention.

DETAILED DESCRIPTION OF ILLUSTRATIVE EMBODIMENTS

Figure 3A:
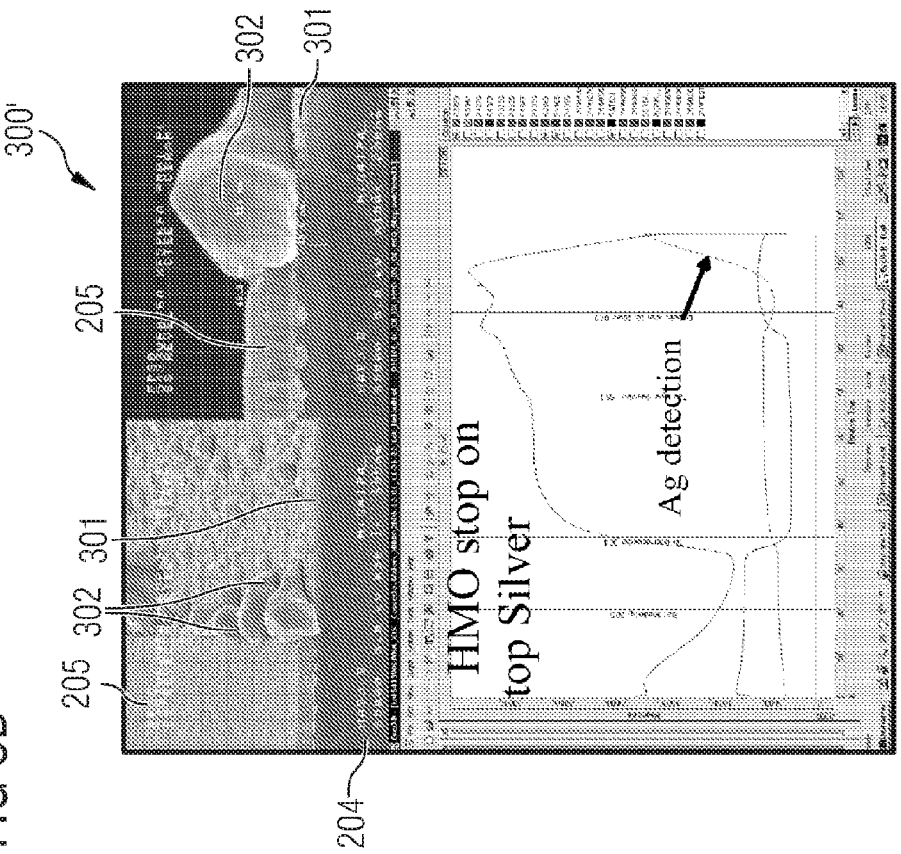
FIG. 3A shows a cross-sectional view of a manufacturing stage of a method of manufacturing a solid electrolyte memory device according to one embodiment of the present invention.

For sake of simplicity, it will be assumed in the following description that the memory device is a solid electrolyte memory device, and that the resistivity changing layer is a solid electrolyte layer. However, the embodiments of the present invention are also applicable to other types of memory devices like magneto-resistive memory devices having other types of resistivity changing layers like magneto-resistive layers.

According to one embodiment of the present invention, a method of manufacturing an integrated circuit comprising a solid electrolyte memory device is provided. The method includes the following processes: providing a mask layer on a composite structure including a solid electrolyte layer and an electrode layer arranged above the solid electrolyte layer; structuring the mask layer to a first vertical level using a first substance, the first vertical level lying above the vertical level of the top surface of the electrode layer; and structuring the mask layer to at least the vertical level of the top surface of the electrode layer (second vertical level) using a second substance, wherein the second substance does not react chemically with the electrode layer material.

According to one embodiment of the present invention, the second substance does not react chemically with the electrode layer material in a way that clusters of electrode material and second substance are formed.

Within the scope of the present invention, the term "mask layer structure" may, for example, mean a single layer or a plurality of layers. The single layer or plurality of layers may for example, be resin layers or hardmask layers or multi level resist layers.

According to one embodiment of the present invention, a method of manufacturing a solid electrolyte memory device is provided. The method includes the following processes: providing a mask layer on a composite structure including a solid electrolyte layer and an electrode layer arranged above the solid electrolyte layer; structuring the mask layer to a first vertical level using a first substance, the first vertical level lying above the vertical level of the top surface of the electrode layer; and structuring the mask layer to at least the vertical level of the top surface of the electrode layer (second vertical level) using a second substance, wherein the second substance does not react chemically with the electrode layer material.

Within the scope of an exemplary embodiment of the present invention, the term "wherein the second substance does not react chemically with the electrode layer material" may be understood such that no new chemical substance is formed when the second substance comes into contact with the electrode layer material. As a consequence, the second substance and the electrode layer material do not form clusters of a second substance and electrode layer material when coming into contact with each other. Alternatively, a new chemical substance is formed which, however, does not form clusters and therefore has no effect on the smoothness of the surface of the electrode layer.

According to one embodiment of the present invention, the first substance includes or consists of a fluorine plasma gas and/or chlorine plasma gas. However, the invention is not restricted to this; any other suitable material (for example, other chemical reactive plasmas) may also be used.

According to one embodiment of the present invention, the second substance includes or consists of a noble plasma gas. For example, the second substance includes or consists of an argon plasma gas or helium plasma gas.

According to one embodiment of the present invention, the electrode layer includes silver or consists of silver. However, the invention is not restricted to this; other materials like silver fluoride (AgF) or silver chloride (AgCl) (these materials are, for example, suitable if the first substance is a chlorine plasma) may also be used. Generally, the material of the electrode layer should be a material which provides conductive material to migrate into the electrolyte and form a conductive path under the influence of a voltage applied to the electrodes.

According to one embodiment of the present invention, the solid electrolyte layer includes germanium sulphide or consists of germanium sulphide. However, the invention is not restricted to this; other suitable material may also be used.

According to one embodiment of the present invention, the mask layer includes a metal layer (more general: conductive layer) and a dielectric layer arranged above the metal layer. The mask layer may also comprise more than two layers.

According to one embodiment of the present invention, the metal layer includes titanium nitride and/or tantalum nitride or consists of titanium nitride and/or tantalum nitride. However, embodiments of the invention are not restricted to this; other materials may also be used.

According to one embodiment of the present invention, the distance between the first vertical level and the vertical level of the top surface of the electrode layer is about 40 percent (more generally: ranges between about 17% and about 50%) of the distance between the vertical level of the top surface of the metal layer and the vertical level of the top surface of the electrode layer.

According to one embodiment of the present invention, the distance between the first vertical level and the vertical level of the top surface of the electrode layer is about 10 nm. More generally, according to one embodiment of the present invention, the distance between the first vertical level and the vertical level of the top surface of the electrode layer ranges between about 10 nm and about 30 nm.

According to one embodiment of the present invention, the solid electrolyte layer is structured using the structured mask layer and the second substance. Thus, no third substance has to be used. The material of the solid electrolyte layer and the second substance may be chosen so as to not react with each other.

The embodiments of the solid electrolyte memory device as described above may be finalized according to known techniques like the deposition of metal layers, isolation layers, encapsulation layers, passivation layers, heat treatments and the like.

According to one embodiment of the present invention, a method of patterning a composite structure including a solid electrolyte layer and an electrode layer arranged above the solid electrolyte layer is provided. The method includes: providing a mask layer on the composite structure; providing a lithographic resist on the mask layer; structuring the lithographic resist (resin layer) using a lithographic process (light exposure process); structuring the mask layer using the structured lithographic resist; and structuring the composite structure using the structured mask layer. The structuring of the mask layer includes: structuring the mask layer to a first vertical level using a first substance, wherein the first vertical level lies above the vertical level of the top surface of the electrode layer, and structuring the mask layer to a second vertical level lying at or below the vertical level of the top surface of the electrode layer using a second substance, wherein the second substance does not react chemically with the electrode layer material.

According to one embodiment of the present invention, a method of manufacturing a memory device is provided, comprising the following processes: forming a mask layer structure above a composite structure comprising a solid electrolyte layer and an electrode layer disposed above the solid electrolyte layer; partially patterning the mask layer structure using a first substance; stopping patterning the mask layer structure before exposing the top surface of the electrode layer; at least partially exposing the top surface of the electrode layer using a second substance, the second substance not reacting chemically with the electrode layer material.

According to one embodiment of the present invention, the first substance is a plasma gas.

According to one embodiment of the present invention, the first substance is a noble plasma gas.

According to one embodiment of the present invention, the first substance is a fluorine plasma gas.

According to one embodiment of the present invention, the second substance is a plasma gas.

According to one embodiment of the present invention, the second substance is a noble plasma gas.

According to one embodiment of the present invention, the second substance is an argon plasma gas.

According to one embodiment of the present invention, the electrode layer comprises metal or consists of metal.

According to one embodiment of the present invention, the electrode layer comprises silver or consists of silver.

According to one embodiment of the present invention, the solid electrolyte layer comprises chalcogenide or consists of chalcogenide.

According to one embodiment of the present invention, the solid electrolyte layer comprises germanium sulphide or consists of germanium sulphide.

According to one embodiment of the present invention, the mask layer structure comprises more than two layers.

According to one embodiment of the present invention, the mask layer structure comprises a metal layer and a dielectric layer disposed above the metal layer.

According to one embodiment of the present invention, the metal layer comprises titanium nitride or tantalum nitride or consists of titanium nitride or tantalum nitride.

According to one embodiment of the present invention, the thickness of the remaining mask layer structure, after having stopped the patterning of the mask layer structure (with the first substance), ranges between about 17 and about 40 percent of the thickness of the metal layer.

According to one embodiment of the present invention, the thickness of the remaining mask layer structure, after having stopped the patterning of the mask layer structure (with the first substance), is at least about 10 nm.

According to one embodiment of the present invention, the solid electrolyte layer is patterned using the patterned mask layer structure and the second substance.

According to one embodiment of the present invention, the second substance does not chemically react with the solid electrolyte layer material.

All embodiments described above may be applied in an analog manner to the following embodiment.

According to one embodiment of the present invention, a method of patterning a composite structure is provided, comprising the following processes: providing a mask layer structure on a composite structure comprising a solid electrolyte layer and an electrode layer disposed above the solid electrolyte layer; providing a mask layer on the mask layer structure; patterning the mask layer using a light exposure process; patterning the mask layer structure using the patterned mask layer; patterning the composite structure using the patterned mask layer structure, wherein the patterning of the mask layer structure comprises the following processes: partially patterning the mask layer structure using a first substance; stopping patterning the mask layer structure before exposing the top surface of the electrode layer; at least partially exposing the top surface of the electrode layer using a second substance, the second substance not reacting chemically with the electrode layer material.

Since the embodiments of the present invention can be applied to programmable metallization cell devices (PMC) (e.g., solid electrolyte devices like CBRAM (conductive bridging random access memory) devices), in the following description, making reference to FIGS. 1A and 1B, a basic principle underlying embodiments of CBRAM devices will be explained.

As shown in FIG. 1A, a CBRAM cell 100 includes a first electrode 101, a second electrode 102, and a solid electrolyte block (in the following also referred to as ion conductor block) 103 which includes the active material and which is sandwiched between the first electrode 101 and the second electrode 102. This solid electrolyte block 103 can also be shared between a plurality of memory cells (not shown here). The first electrode 101 contacts a first surface 104 of the ion conductor block 103, the second electrode 102 contacts a second surface 105 of the ion conductor block 103. The ion conductor block 103 is isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, the second electrode 102 includes tungsten (W), and the isolation structure 106 includes $SiO_2$ or $Si_3N_4$. The present invention is however not restricted to these materials. For example, the first electrode 101 may alternatively or additionally include copper (Cu) or zinc (Zn), and the ion conductor block 103 may alternatively or additionally include copper-doped chalcogenide material. Further, the second electrode 102 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned materials, and can also include alloys of the aforementioned materials. The thickness of the ion conductor 103 may, for example, range between about 5 nm and about 500 nm. The thickness of the first electrode 101 may, for example, range between about 10 nm and about 100 nm. The thickness of the second electrode 102 may, for example, range between about 5 nm and about 500 nm, between about 15 nm to about 150 nm, or between about 25 nm and about 100 nm. It is to be understood that the present invention is not restricted to the above-mentioned materials and thicknesses.

In the context of this description, chalcogenide material (ion conductor) is to be understood, for example, as any compound containing oxygen, sulphur, selenium, germanium and/or tellurium. In accordance with one embodiment of the invention, the ion conducting material is, for example, a compound, which is made of a chalcogenide and at least one metal of the group I or group II of the periodic system, for example, arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 1A is applied across the ion conductor block 103, a redox reaction is initiated which drives $Ag^+$ ions out of the first electrode 101 into the ion conductor block 103 where they are reduced to Ag, thereby forming Ag rich clusters 108 within the ion conductor block 103. If the voltage applied across the ion conductor block 103 is applied for an enhanced period of time, the size and the number of Ag rich clusters within the ion conductor block 103 is increased to such an extent that a conductive bridge 107 between the first electrode 101 and the second electrode 102 is formed. In case that a voltage is applied across the ion conductor 103 as shown in FIG. 1B (inverse voltage compared to the voltage applied in FIG. 1A), a redox reaction is initiated which drives $Ag^+$ ions out of the ion conductor block 103 into the first electrode 101 where they are reduced to Ag. As a consequence, the size and the number of Ag rich clusters within the ion conductor block 103 is reduced, thereby erasing the conductive bridge 107. After having applied the voltage/inverse voltage, the memory cell 100 remains within the corresponding defined switching state even if the voltage/inverse voltage has been removed.

In order to determine the current memory status of a CBRAM cell, for example, a sensing current is routed through the CBRAM cell. The sensing current experiences a high resistance in case no conductive bridge 107 exists within the CBRAM cell, and experiences a low resistance in case a conductive bridge 107 exists within the CBRAM cell. A high resistance may, for example, represent "0", whereas a low resistance represents "1", or vice versa. The memory status detection may also be carried out using sensing voltages. Alternatively, a sensing voltage may be used in order to determine the current memory status of a CBRAM cell.

FIGS. 2A and 2B show a method 200 of manufacturing a solid electrolyte memory device.

In a first process (FIG. 2A), a composite structure 201 is provided which includes an inert electrode layer 202, a solid electrolyte layer 203 and a reactive electrode layer 204. The reactive electrode layer 204 is covered with a mask layer 205. The inert electrode layer 202 may, for example, include or consist of tungsten (W), the solid electrolyte layer 203 may, for example, comprise or consist of silver doped chalcogenide material, and the reactive electrode layer 204 may for example include or consist of silver (Ag). The mask layer may for example be a hard mask including a metal layer and a dielectric layer being arranged on the metal layer. The metal layer may, for example, include a TaN layer and a TiN layer disposed on the TaN layer, wherein the thicknesses of the TaN layer may, for example, be about 10 nm, and the thickness of the TiN layer may for example be about 50 nm.

In a second process (FIG. 2B), the mask layer 205 is structured ("opened"), i.e., etched down to the vertical level of the top surface of the reactive electrode layer 204 using a first substance, for example, a fluorine plasma gas, thereby generating a mask opening area 206. According to one embodiment, a photoresist layer (not shown) which initially covers the mask layer 205 is patterned to define the opening area 206. Then, the composite structure 201 is structured using the structured mask layer 205 and a second substance, for example, an argon plasma gas.

However, if a fluorine plasma gas is used to etch the structured mask layer 205 down to a reactive electrode layer 204 including silver, the fluorine will chemically react with the silver of the reactive electrode layer 204. As a consequence, undesired silver-fluorine clusters are formed on the top surface of the reactive electrode layer 204. The silver-fluorine clusters destroy the smoothness of the top surface of the reactive electrode layer 204, thereby influencing the electrical characteristics (reproducibility) of the solid electrolyte memory device to be fabricated.

Figure 3B:
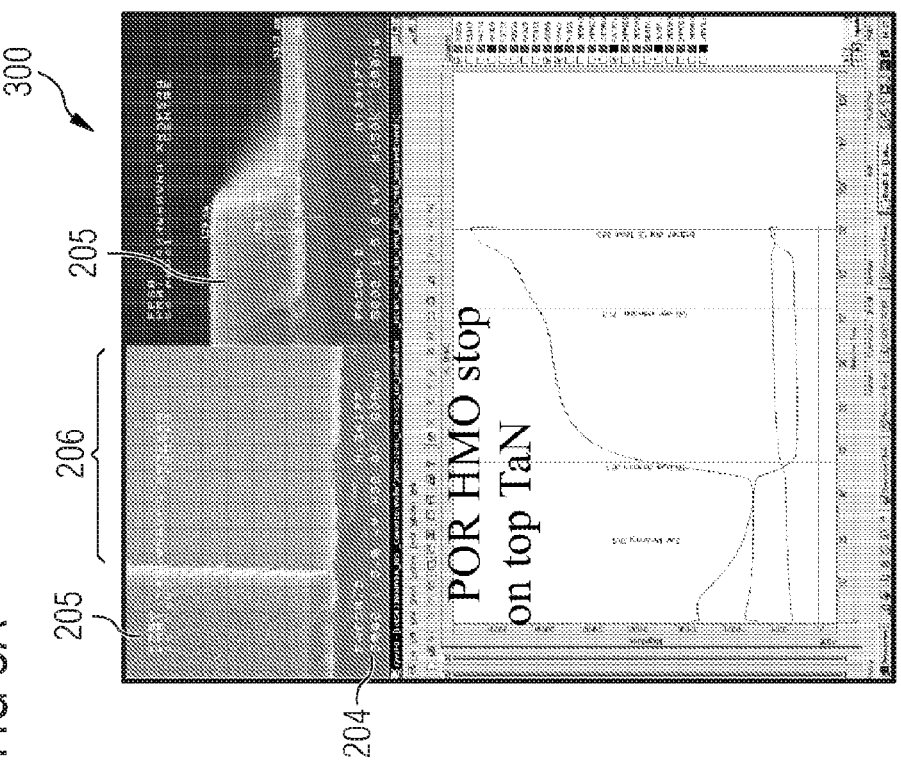
FIG. 3B shows a cross-sectional view of a manufacturing stage of a method of manufacturing a solid electrolyte memory device.

This situation is shown in FIG. 3B: on the top surface 301 of a reactive electrode layer 204 which has been exposed by the structuring process of the hard mask 205 shown in FIGS. 2A and 2B (top surface of the reactive electrode layer 204 within the mask opening area 206), fluorine-silver clusters 302 have been formed destroying the evenness of the top surface of the reactive electrode layer 204.

Figure 5A:
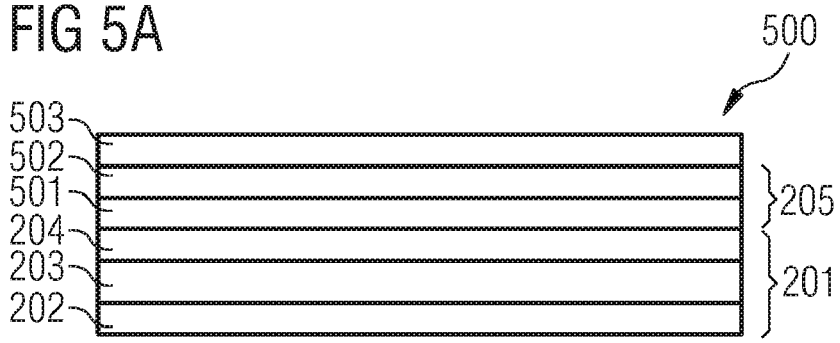
FIGS. 5A to 5D show schematic cross-sectional views of manufacturing stages of a method of manufacturing a solid electrolyte memory device according to one embodiment of the present invention.
Figure 5B:
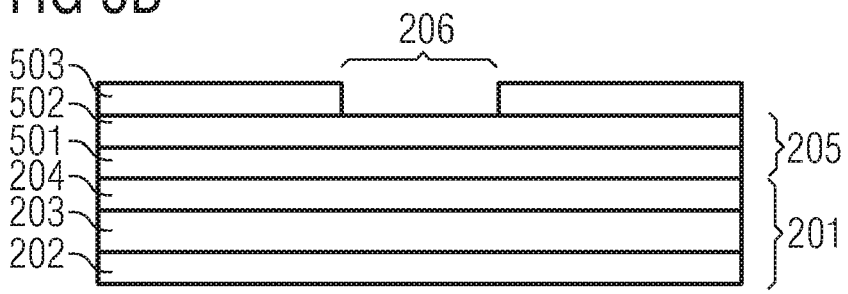
Figure 5C:
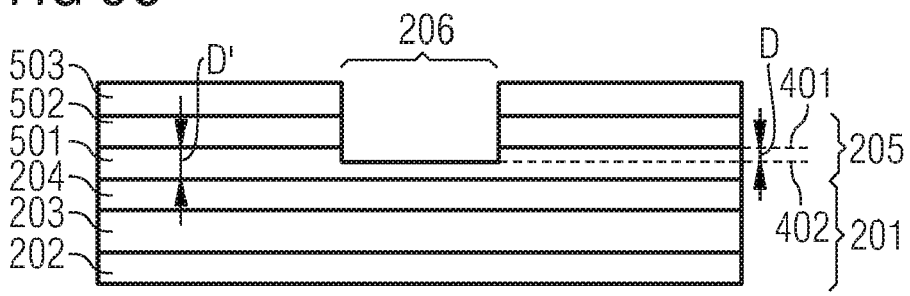

FIG. 3A shows the processing state of a method of manufacturing a solid electrolyte memory device according to the present invention corresponding, for example, to the processing stages shown in FIGS. 4B and 5C: as can be derived from FIG. 3A, no clusters have been formed on the top surface 301 of the reactive electrode layer 204 within the mask opening area 206 so far.

FIGS. 4A to 4C show a method 400 of manufacturing a solid electrolyte memory device according to the present invention, which avoids the problems mentioned above.

In a first process (FIG. 4A), a composite structure 201 including an inert electrode layer 202, a solid electrolyte layer 203 and a reactive electrode layer 204 being stacked above each other in this order is provided. The top surface of the reactive electrode layer 204 is covered with a mask layer 205. Here, it is assumed that the solid electrolyte layer 203 is a silver doped chalcogenide material layer, and the reactive electrode layer 204 includes silver.

In a second process (FIG. 4B), the mask layer 205 is structured to a first vertical level 401 using a first substance, wherein the first vertical level 401 lies above a vertical level 402 of the top surface of the reactive electrode layer 204. This may, for example, be done using a patterned photoresist layer. However, this may also be achieved in a different way. In this way, a mask opening area 206 is generated. The first substance used to structure the mask layer 205 to the first vertical level 401 may be an arbitrary substance. In particular, it is possible to use a substance which chemically reacts with silver since the first substance will not get into contact with silver of the reactive electrode layer 204 (the first vertical level 401 lies above the vertical level 402 of the top surface of the reactive electrode layer 204).

In a third process (FIG. 4C), the hard mask is further etched down to at least the vertical level 402 of the top surface of the reactive electrode layer 204 using a second substance which does not react chemically with the silver included within the reactive electrode layer 204 (e.g., which does not react chemically with any material included within the reactive electrode layer 204). To be more general: the second substance does not react chemically with the silver (or with a different material) included within the reactive electrode layer 204 such that clusters of reactive electrode layer material and second substance are formed.

In this way, it is possible to use a substance (for example, fluorine plasma gas) for structuring the mask layer 205 which would chemically react with material included within the reactive electrode layer 204, however at the same time to avoid the formation of undesired clusters on the top surface of the reactive electrode layer 204.

As already indicated above, the first substance may be a fluorine plasma gas, whereas the second substance may be a noble plasma gas, for example, an argon plasma gas.

The distance D between the first vertical level 401 and the second vertical level 402 may, for example, be about 10 nm or less. According to one embodiment of the present invention, the minimum of D is about 10 nm, and the maximum of D is about 30 nm.

After having opened the mask layer 205 as described above, the composite structure 201 can be structured using the opened mask layer 205 as a structuring mask. The structuring of the composite structure 201 may be done using the second substance or at least partially using a different substance. For example, in order to structure the reactive electrode layer 204, the second substance may be used. Then, in order to structure the solid electrolyte layer 203, a third substance which does not react chemically with the materials of the solid electrolyte layer 203 may be used. In this way, each substance can be "tailored" to the chemical properties of the respective layer or layers which is/are structured by the substance. Thus, the formation of clusters on the surfaces of the structured layers of the composite structure 201 is avoided.

FIGS. 5A to 5D show a method 500 of manufacturing a solid electrolyte memory device according to one embodiment of the present invention which may be interpreted as a detailed description of the method 400 shown in FIGS. 4A to 4C.

In a first process (FIG. 5A), a composite structure 201 comprising an inert electrode layer 202, a solid electrolyte layer 203 and a reactive electrode layer 204 stacked above each other in this order is provided. The inert electrode layer 202, the solid electrolyte layer 203 and the reactive electrode layer 204 may be of the same materials as those shown in FIGS. 4A to 4C, for example. The top surface of the reactive electrode layer 204 is covered with a mask layer 205 comprising a metal layer 501 (for example, tantalum nitride (TaN) or titanium nitride (TiN)) and a dielectric layer 502 arranged above the metal layer 501. On the mask layer 205, a resist (e.g., resin) layer 503 is provided. The metal layer (conductive layer) 501 may, for example, include a TaN layer and a TiN layer disposed on the TaN layer, wherein the thicknesses of the TaN layer may, for example, be about 10 nm, and the thickness of the TiN layer may for example be about 50 nm. The dielectric layer 502 may, for example, be an oxide layer (for example, including or consisting of $SiO_2$). The dielectric layer 502 may, for example, have a thickness of about 80 nm.

In a second process (FIG. 5B), the resist layer 503 is structured by a lithographic process (exposure to light), thereby forming a mask opening area 206.

In a third process (FIG. 5C), the mask layer 205 (hard mask) is structured to a first vertical level 401 lying above the vertical level 402 of the top surface of the reactive electrode layer 204. This structuring process is carried out using a first substance, for example, a fluorine plasma gas. Assuming that the metal layer 501 includes a TaN layer and a TiN layer disposed on the TaN layer, wherein the thicknesses of the TaN layer is about 10 nm, and the thickness of the TiN layer is about 50 nm, according to an embodiment of the present invention, at least the whole TaN layer will remain on the reactive electrode layer 204 after having carried out the structuring process, wherein the maximum thickness of the TiN layer after having carried out the structuring process is about 20 nm.

In a fourth process (FIG. 5D), the mask layer 205 is structured to a second vertical level lying at or below the vertical level 402 of the top surface of the reactive electrode layer 204 using a second substance which does not react chemically with the material of the reactive electrode layer 204. For example, the second substance is an argon plasma gas.

Figure 5D:
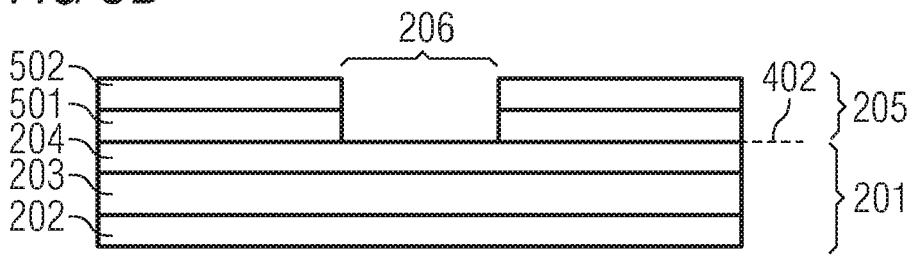

After having opened the mask layer 205 as described above, the composite structure 201 can be structured using the mask layer 205 as a structuring mask. The structuring of the composite structure 201 may, for example, be done using the second substance. Before doing this, the resist layer 503 may be removed ("stripped"). Generally, the resist layer 503 can be removed after the third process (FIG. 5C) or after the fourth process (FIG. 5D).

The distance D between the first vertical level 401 and the vertical level 402 of the top surface of the reactive electrode layer 204 may be at least 40 percent of the distance D' between the resist layer 503 of the top surface of the metal layer 501 and the vertical level 401 of the top surface of the reactive electrode layer 204.

FIG. 6 shows a method 600 of manufacturing a solid electrolyte memory device according to one embodiment of the present invention. In a first process P1, a mask layer is provided on a composite structure including a solid electrolyte layer and an electrode layer arranged above the solid electrolyte layer. In a second process P2, the mask layer is structured to a first vertical level using a first substance, wherein the first vertical level lies above the vertical level of the top surface of the electrode layer. In a third process P3, the mask layer is structured to at least a second vertical level being the vertical level of the top surface of the electrode layer using a second substance. The second substance does not react chemically with the electrode layer material.

FIG. 7 shows a further method 700 of manufacturing a solid electrolyte memory device according to one embodiment of the present invention. In a first process S1, a mask layer is provided on a composite structure. In a second process S2, a resin layer is provided on the mask layer. In a third process S3, the resin layer is structured using a light exposure process. In a fourth process S4, the mask layer is structured to a first vertical level using the structured resin layer and a first substance, wherein the first vertical level lies above the vertical level of the top surface of the electrode layer. In a fifth step S5, the mask layer is structured to at least a second vertical level lying at or below the vertical level of the top surface of the electrode layer using the structured resin layer and a second substance, wherein the second substance does not react chemically with the electrode layer material. In a sixth process S6, the composite structure is structured using the structured mask layer.

According to one embodiment of the present invention, a method of manufacturing memory devices of high quality and reproducibility is provided.

In the following descriptions, further aspects of the present invention will be explained.

According to one embodiment of the present invention, CBRAM chalcogenide is patterned with control of silver migration by preventing an interaction between silver and reactive chemistry.

The design of CBRAM junctions may be done by PL etching. The PL etching may be carried out using plasma etching with a double hard mask (dielectric layer and metal layer). According to embodiments of the present invention, a reaction of silver with plasma fluorine chemistry used for the hard mask open is avoided.

The double hard mask may be etched using a resist mask, wherein the entire hard mask (dielectric layer and metal layer) is etched using fluorine chemistry, i.e., the etching process is stopped on the silver layer. After a strip of a resist (e.g., resin) layer arranged on the hard mask, the dielectric hard mask is used for silver based chalcogenide patterning with argon chemistry. Using this sequence of processes, a chemical reaction between the silver at the end of the hard mask open process and the fluorine chemistry is observed. To etch the silver layer (electrode layer) without corrosion, argon plasma chemistry may be used. According to one embodiment of the present invention, the opening of the hard mask is stopped earlier, just before opening the silver layer, and the etching of the remaining metal hard mask layer with argon plasma, like silver and germanium sulphide patterning, is postponed after the strip resist.

As has become apparent, if the fluorine plasma was used to etch the entire hard mask stack, and if the etching process was stopped in the silver layer (with a small recess inside) the silver layer was in direct contact with fluorine plasma gas. Therefore, Ag—F clusters would grow on all the open surfaces of the wafer. Just after the full hard mask open, a lot of residue would be existing on the opening surface everywhere across the wafer. Thus, according to an embodiment of the present invention, the contact between the silver material and fluorine plasma gas is avoided.

According to one embodiment of the present invention, a partial hard mask open step is carried out. A thin residual hard mask is kept on top of the silver during the hard mask open step. The resist is stripped and the etching of the residual hard mask open is delayed during the CB stack patterning itself (with same non-corrosive chemistry), with a specific step (power adjusted with Argon plasma). Referring to FIG. 5B, the term "CB stack" means the stack formed by the layers 203 and 204. The term "PL stack" means the stack formed by the layers 203, 204, 205, and 503.

During the etching process of the hard mask, a specific wavelength (pink trace) gives the capability to check that the silver is not in contact with the fluorine chemistry during the hard mask open. The partial hard mask open succeeds to suppress all defects due to the silver reaction on the open area (FIG. 3A).

As used herein, the terms "connected" and "coupled" are intended to include both direct and indirect connection and coupling, respectively.

In the context of this description chalcogenide material (ion conductor) is to be understood, for example, as any compound containing sulphur, selenium, germanium and/or tellurium. In accordance with one embodiment of the invention, the ion conducting material is for example, a compound, which is made of a chalcogenide and at least one metal of the group I or group II of the periodic system, for example, arsenic-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper and zinc or a combination or an alloy of these metals.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of manufacturing an integrated circuit the method comprising:
    forming a mask layer structure above a composite structure, the composite structure comprising a resistivity changing layer and an electrode layer disposed above the resistivity changing layer, the electrode layer having a top surface;
    partially patterning the mask layer structure using a first substance;
    stopping patterning the mask layer structure before exposing the top surface of the electrode layer; and
    at least partially exposing the top surface of the electrode layer using a second substance, the second substance not reacting chemically with an electrode layer material such that clusters of electrode material and second substance are formed.

2. The method according to claim 1, wherein the first substance comprises a plasma gas.

3. The method according to claim 2, wherein the first substance comprises a noble plasma gas.

4. The method according to claim 3, wherein the first substance comprises a fluorine plasma gas.

5. The method according to claim 1, wherein the second substance comprises a plasma gas.

6. The method according to claim 5, wherein the second substance comprises a noble plasma gas.

7. The method according to claim 6, wherein the second substance comprises an argon plasma gas.

8. The method according to claim 1, wherein the electrode layer comprises metal.

9. The method according to claim 8, wherein the electrode layer comprises silver.

10. The method according to claim 1, wherein the resistivity changing layer comprises chalcogenide.

11. The method according to claim 10, wherein the resistivity changing layer comprises germanium sulphide.

12. The method according to claim 1, wherein the mask layer structure comprises at least two layers.

13. The method according to claim 12, wherein the mask layer structure comprises a metal layer and a dielectric layer disposed above the metal layer.

14. The method according to claim 13, wherein the metal layer comprises titanium nitride or tantalum nitride.

15. The method according to claim 13, wherein after stopping the patterning of the mask layer structure a remaining portion of the mask layer structure has a thickness of at least 40 percent of an original thickness of the metal layer.

16. The method according to claim 13, wherein after stopping the patterning of the mask layer structure, a remaining portion of the mask layer structure has a thickness of at least 10 nm.

17. The method according to claim 1, further comprising patterning the resistivity changing layer using the patterned mask layer structure and the second substance.

18. The method according to claim 17, wherein the second substance does not significantly chemically react with a resistivity changing layer material.

19. The method according to claim 1, wherein no chemical substance is formed when the second substance comes into contact with the electrode layer material.

20. A method of patterning a composite structure, the method comprising:
 forming a mask layer structure on a composite structure, the composite structure comprising a resistivity changing layer and an electrode layer disposed above the resistivity changing layer;
 forming a mask layer over the mask layer structure;
 patterning the mask layer using a light exposure process;
 patterning the mask layer structure using the patterned mask layer; and
 patterning the composite structure using the patterned mask layer structure;
 wherein patterning of the mask layer structure comprises:
  partially patterning the mask layer structure using a first substance;
  stopping patterning the mask layer structure before exposing a top surface of the electrode layer; and
  at least partially exposing the top surface of the electrode layer using a second substance, the second substance not reacting chemically with an electrode layer material in a way that clusters of electrode material and second substance are formed.

21. The method according to claim 20, wherein the first substance comprises a fluorine plasma gas.

22. The method according to claim 20, wherein the second substance comprises a noble plasma gas.

23. The method according to claim 22, wherein the second substance comprises an argon plasma gas.

24. The method according to claim 20, wherein the electrode layer comprises silver.

* * * * *